(12) United States Patent
Iwamoto et al.

(10) Patent No.: US 7,427,824 B2
(45) Date of Patent: Sep. 23, 2008

(54) PIEZOELECTRIC DEVICE AND METHOD FOR PRODUCING SAME

(75) Inventors: Takashi Iwamoto, Kusatsu (JP); Yasunori Kishimoto, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 11/774,023

(22) Filed: Jul. 6, 2007

(65) Prior Publication Data

US 2007/0252481 A1 Nov. 1, 2007

Related U.S. Application Data

(63) Continuation of application No. PCT/JP06/11851, filed on Jun. 13, 2006.

(30) Foreign Application Priority Data

Jun. 16, 2005 (JP) ............... 2005-176129
Jun. 6, 2006 (JP) ............... 2006-157895

(51) Int. Cl.
*H00L 41/08* (2006.01)
(52) U.S. Cl. .................... 310/344; 310/313 R
(58) Field of Classification Search ............ 310/344, 310/348, 313 R
See application file for complete search history.

(56) References Cited

U.S. PATENT DOCUMENTS

| 5,939,817 | A  | * | 8/1999  | Takado ................. 310/348 |
| 6,969,945 | B2 | * | 11/2005 | Namba et al. ........... 310/340 |
| 7,102,272 | B2 |   | 9/2006  | Koshido                         |
| 7,205,705 | B2 |   | 4/2007  | Iwamoto                         |
| 7,259,500 | B2 | * | 8/2007  | Iwamoto et al. ......... 310/340 |
| 7,282,835 | B2 | * | 10/2007 | Kawakami ............. 310/313 A |

FOREIGN PATENT DOCUMENTS

| JP | 06-164292 A    | 6/1994  |
| JP | 2000-353934 A  | 12/2000 |
| JP | 2002-217673 A  | 8/2002  |
| JP | 2003-37471 A   | 2/2003  |
| JP | 2003-46017 A   | 2/2003  |
| JP | 2003-188669 A  | 7/2003  |
| JP | 2004-129224 A  | 4/2004  |
| JP | 2004-165874 A  | 6/2004  |
| JP | 2004-248243 A  | 9/2004  |
| JP | 2004-282175 A  | 10/2004 |
| JP | 2005-033689 A  | 2/2005  |
| JP | 2005-79694 A   | 3/2005  |

OTHER PUBLICATIONS

Official Communication for PCT Application No. PCT/JP2006/311851; mailed Sep. 12, 2006.

* cited by examiner

*Primary Examiner*—Mark Budd
(74) *Attorney, Agent, or Firm*—Keating & Bennett, LLP (57) ABSTRACT

A piezoelectric device ensures resistance to molding without an increase in costs and includes an elemental substrate having a piezoelectric element and a conductive pattern electrically connected to the piezoelectric element; and insulating members disposed on the elemental substrate and surrounding the piezoelectric element leaving a space around the piezoelectric element. The insulating members have an internal conductor connected to the conductive pattern and extending apart from the elemental substrate. The internal conductor has expanded portions expanding in a direction intersecting the wiring direction of the internal conductor or a detour portion deviating from the wiring direction. The expanded portions or the detour portion crosses the boundary of a sealed space formed around the piezoelectric element.

16 Claims, 13 Drawing Sheets

FIG. 25B

PIEZOELECTRIC DEVICE AND METHOD FOR PRODUCING SAME

FIELD OF THE INVENTION

The present invention relates to a piezoelectric device and a method for producing the same. In particular, the present invention relates to a piezoelectric device including a piezoelectric substrate and a piezoelectric element; and a method for producing the piezoelectric device.

DESCRIPTION OF THE RELATED ART

In piezoelectric devices, such as resonators and filters, including piezoelectric substrates and piezoelectric films, a construction in which piezoelectric vibration spaces are formed by mainly buildup structures including resins and the like has been known.

For example, Japanese Unexamined Patent Application Publication No. 2004-165874 discloses that in a structure in which IDT electrodes overlaid with a cover and protruding electrodes protruding from pad electrodes, the protruding electrodes being disposed outside the cover, are disposed on a piezoelectric substrate and in which they are covered with an insulating layer and a resin layer, the IDT electrodes have improved moisture resistance because the surface of the cover is overlaid with the insulating layer composed of a Si-based compound.

Japanese Unexamined Patent Application Publication No. 6-164292 discloses that in a structure in which spaces formed around a vibrator are sealed with spacers surrounding a vibrator, the spacers being bonded to a piezoelectric substrate, and with sealing films bonded to the spacers, the sealing films are each formed of a metal sheet or the like, and a reinforcing layer formed of a ceramic sheet or a metal sheet is disposed between the sealing films and a second armor disposed outside the sealing films.

Japanese Unexamined Patent Application Publication No. 2003-37471 discloses that in a structure in which a resonator element disposed on a surface of the piezoelectric substrate is covered with a resin substrate so as to be distant from the resin substrate, a metal layer is disposed on the entirety of the surface of the resin substrate facing the piezoelectric substrate so as to inhibit the permeation of water and gases passing through the resin substrate.

Japanese Unexamined Patent Application Publication No. 2004-165874 discloses that input/output electrodes for connection with the SAW chip, a ground electrode, and a conductive pattern surrounding the ground electrode so as to obtain inductance are provided on the side of a mounting substrate on which a SAW chip is mounted.

As described above, such construction in which piezoelectric vibration spaces are formed by mainly buildup structures including resins and the like contributes advantageously to a reduction in profile.

However, in the case where after a piezoelectric device sealed with a buildup structure including a resin is mounted on a circuit substrate, the resulting component is resin-molded together with another chip such as a semiconductor chip, the piezoelectric device may collapse because resin molding is generally performed under high-temperature and high-pressure conditions.

Thus, for example, countermeasures to increase strength with the insulating layer composed of the Si-based compound described in Japanese Unexamined Patent Application Publication No. 2004-165874 may be taken. However, costs are inevitably increased because of an increase in the number of steps, the necessity for the insulating layer to have a thickness of at least 10 μm in order to withstand such resin molding performed under the high-temperature and high-pressure conditions, and the necessity to separately perform the formation of vias for extraction electrodes.

SUMMARY OF THE INVENTION

To overcome the foregoing problems, the present invention provides a piezoelectric device having resistance to molding and a method for producing the piezoelectric device that does not cause an increase in cost.

According to a preferred embodiment of the present invention, a piezoelectric device includes an elemental substrate including a piezoelectric element and a conductive pattern electrically connected to the piezoelectric element disposed on at least one main surface of the elemental substrate, an insulating member disposed on the main surface side of the elemental substrate and surrounding the piezoelectric element leaving a space around the piezoelectric element, and an internal conductor disposed in the insulating member so as to be connected to the conductive pattern, and extending so as to be spaced apart from the elemental substrate. The internal conductor includes an expanded portion expanding in a direction intersecting the wiring direction of the internal conductor or a detour portion out of the wiring direction. The expanded portion or the detour portion crosses the boundary of the space (hereinafter, referred to as a "sealed space") formed around the piezoelectric element when viewed from the direction normal to the main surface of the elemental substrate.

The internal conductor having the above described structure can reinforce the side of the insulating member forming the periphery of the sealed space. Thus, even when a pressure is applied to the piezoelectric device from the outside during resin molding, the piezoelectric device does not collapse.

According to this unique structure, the piezoelectric device has increased strength without the addition of a special step or a special component. The internal conductor preferably is generally formed of a metal film, thus ensuring the strength of the sealed space without the inhibition of miniaturization or a reduction in profile.

Preferably, the sealed space has a substantially rectangular shape when viewed from the direction normal to the main surface of the elemental substrate. The internal conductor has a portion intersecting at least two opposite sides of the sealed space when viewed from the direction normal to the main surface of the elemental substrate. The portion includes the expanded portion or the detour portion.

According to the above-described unique structure, the expanded portion or the detour portion may intersect the sealed space alone or together with a portion of the internal conductor other than the expanded portion or the detour portion when viewed from the direction normal to the main surface of the elemental substrate.

According to the above-described unique structure, the strength of the sealed space is easily ensured.

Preferably, the sealed space has a substantially rectangular shape when viewed from the direction normal to the main surface of the elemental substrate. The internal conductor has a portion intersecting at least two adjacent sides of the sealed space when viewed from the direction normal to the main surface of the elemental substrate. The portion includes the expanded portion or the detour portion.

According to the above-described unique structure, the expanded portion or the detour portion may intersect the sealed space alone or together with a portion of the internal conductor other than the expanded portion or the detour portion when viewed from the direction normal to the main surface of the elemental substrate.

According to the above-described unique structure, the strength of the sealed space is easily ensured.

Preferably, the internal conductor is disposed on ½ or more of the area of the sealed space when viewed from the direction normal to the main surface of the elemental substrate.

According to the above-described unique structure, the strength of the sealed space is easily ensured.

Preferably, the internal conductor is disposed on substantially the entire area of the sealed space when viewed from the direction normal to the main surface of the elemental substrate.

According to the above-described unique structure, the strength is easily ensured.

Preferably, at least a portion of the internal conductor disposed within the sealed space is formed of a plating film composed of a metal material when viewed from the direction normal to the main surface of the elemental substrate.

According to the above-described unique structure, the plating film of the internal conductor preferably has a large thickness, thereby ensuring the strength of the sealed space without an increase in costs.

Preferably, the metal plating film of the internal conductor has a thickness of about 10 μm or more.

According to the above-described unique structure, sufficient strength can be ensured.

Preferably, the internal conductor includes a metal material having an elastic modulus of about $1.3 \times 10^{11}$ Pa or more.

The internal conductor having a higher elastic modulus has more resistant to deformation and has thus higher strength, provided that the thickness is constant.

Preferably, the internal conductor is composed of a metal material mainly containing Ni.

Nickel satisfies requirements, such as plating properties, strength, interconnection resistance, and inexpensiveness, for the internal conductor.

Preferably, the piezoelectric element is an element utilizing a surface acoustic wave or a bulk wave.

In this case, it is possible to provide a piezoelectric device having resistance to molding and a high-strength package structure without an increase in costs.

Preferably, the piezoelectric element includes the expanded portion or the detour portion used as a circuit element or part of a circuit element. The expanded portion or the detour portion may be electrically connected to the piezoelectric element.

Preferably, the piezoelectric element includes the expanded portion or the detour portion used as an inductor. The expanded portion or the detour portion may be electrically connected to the piezoelectric element.

Preferably, the piezoelectric element includes the expanded portion or the detour portion used as part of a capacitor. The expanded portion or the detour portion may be electrically connected to the piezoelectric element.

In this case, a circuit element, such as an inductor or a capacitor, required to satisfy device properties can be efficiently formed while the strength of the sealed space is ensured, thereby reducing the size of the device.

In addition, to overcome the foregoing problems, another preferred embodiment of the present invention provides a method for producing a piezoelectric device as follows.

The method for producing a piezoelectric device includes a first step of forming a piezoelectric element and a conductive pattern on at least one main surface of an elemental substrate, the conductive pattern being electrically connected to the piezoelectric element, and a second step of forming an insulating member disposed on the main surface side of the elemental substrate and surrounding the piezoelectric element leaving a space around the piezoelectric element and forming an internal conductor in the insulating member, connected to the conductive pattern, and extending so as to be spaced apart from the elemental substrate. The second step further including a substep of forming a reinforcing portion reinforcing the strength of the space formed around the piezoelectric element simultaneously with the formation of the internal conductor in the insulating member.

According to the above-described unique method, a piezoelectric device having a high-strength package structure and resistance to molding can be provided with no increase in costs.

According to the piezoelectric device and the method for producing the piezoelectric device, resistance to molding can be ensured without an increase in costs.

Other features, elements, steps, characteristics and advantages of the present invention will be described below with reference to preferred embodiments thereof and the attached drawings.

DETAILED DESCRIPTION OF PREFERRED EMBODIMENTS

Preferred embodiments and examples of the present invention will be described below with reference to FIGS. 1 to 25B.

EXAMPLE 1

A piezoelectric device 10 according to EXAMPLE 1 will be described with reference to FIGS. 1 to 16.

Figure 1:
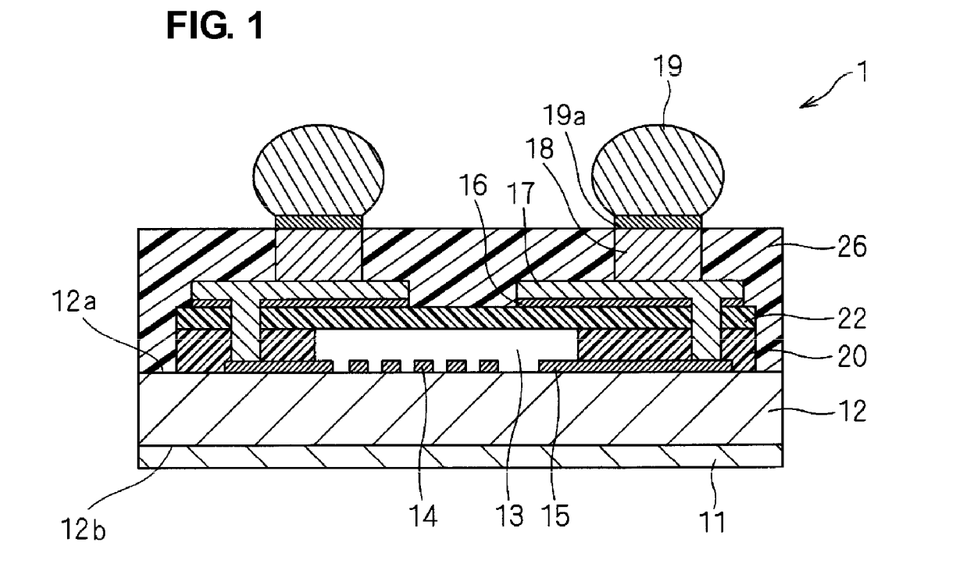
FIG. 1 is a cross-sectional view of a piezoelectric device according to a first preferred embodiment of the present invention.

Referring to FIG. 1 that is a cross-sectional view, the piezoelectric device 10 is a surface acoustic wave (SAW) filter. A conductive pattern including an interdigital transducer (IDT) 14 with interdigital electrodes, reflectors, pad electrodes 15, interconnection lines, and the like is formed on one main surface, i.e., a top surface 12a, of a piezoelectric substrate 12. A protective film 11 is formed on the other main surface, i.e., a bottom surface 12b, of the substrate 12. According to desired properties, a quartz substrate, a LiTaO$_3$ substrate, LiNbO$_3$ substrate, a substrate including a ZnO thin film, or other suitable material is used as the substrate 12.

A support layer 20, which is a first resin portion, is formed on the top surface 12a of the piezoelectric substrate 12 and on the pad electrodes 15 so as to surround the IDT 14. A cover layer 22, which is a second resin portion, is disposed on the support layer 20 so as to be distant from the piezoelectric substrate 12. The cover layer 22 extends substantially along the piezoelectric substrate 12. The support layer 20, which is an insulating member, and the cover layer 22 constitute a sealed space 13 enclosing the IDT 14. A surface acoustic wave propagates on a portion of the top surface 12a of the piezoelectric substrate 12 adjacent to the sealed space 13 without limitation.

The entirety of the cover layer 22 and the periphery of the top face 12a of the piezoelectric substrate 12 are covered with an exterior resin 26. External terminals 19 are exposed from the exterior resin 26. The external terminals 19 are electrically connected to the pad electrodes 15 through internal conductors 16, 17, and 18 and underbump metal layers 19a disposed in through holes (via holes) and the like that are formed in the support layer 20, cover layer 22, and the exterior resin 26. The external terminals 19 are electrically connected to terminals and the like of a circuit substrate when the piezoelectric device 10 is mounted.

Referring to FIGS. 2 to 15, a process of producing the piezoelectric device 10 will be described below. FIGS. 2 to 15 each show a portion corresponding to substantially one piezoelectric device 10 having a final shape. In fact, a collective substrate including portions corresponding to a plurality of piezoelectric devices 10 two-dimensionally arranged, e.g., in a matrix, is produced.

Figure 2:
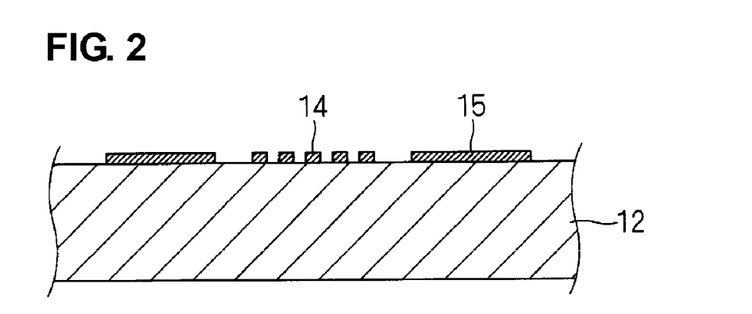
FIG. 2 is an explanatory drawing of a process of producing the piezoelectric device according to the first preferred embodiment of the present invention.

As shown in FIG. 2, first wiring layers to be formed into the conductive pattern including the IDT 14, the reflectors, the pad electrodes 15, the interconnection lines, and the like are formed on the piezoelectric substrate 12. That is, a lift-off resist pattern having openings through which the conductive pattern will be formed is formed by photolithography on the piezoelectric substrate 12. A metal film mainly composed of Al is formed by evaporation. The resulting substrate is immersed and shaken in a stripping solution to remove the resist pattern by lift-off, thereby forming the first wiring layers.

Figure 3:
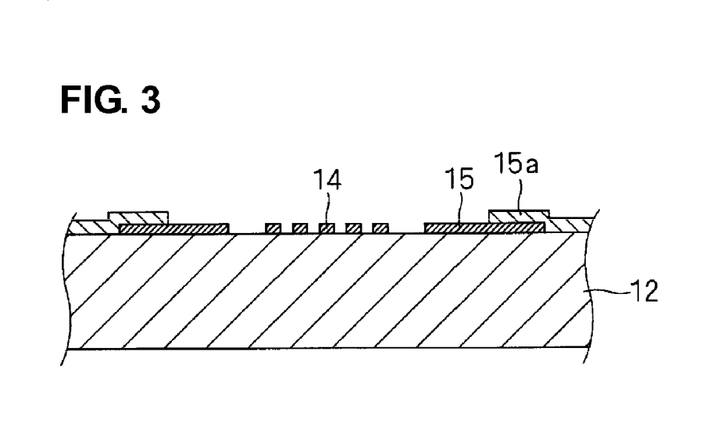
FIG. 3 is an explanatory drawing of the process of producing the piezoelectric device according to the first preferred embodiment of the present invention.

As shown in FIG. 3, second wiring layers 15a are formed. That is, a resist pattern having openings which communicate with the pad electrodes 15, the interconnection lines, and the like and through which a metal film for reducing interconnection resistance will be formed is produced. Then the metal film is formed by evaporation. After lift-off, the second wiring layers 15a are formed. The metal film may be composed of Al, Cu, Ni, Au, and Pt. Alternatively, the metal film may have a multilayer structure of these metals. If plating is performed, the surface layer of each of the second wiring layers is preferably composed of Cu, Ni, Au, or Pt having satisfactory plating properties.

Figure 4:
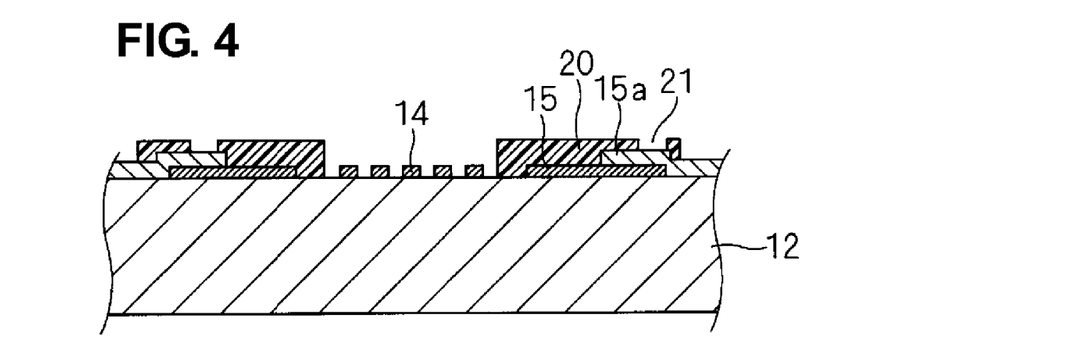
FIG. 4 is an explanatory drawing of the process of producing the piezoelectric device according to the first preferred embodiment of the present invention.

As shown in FIG. 4, the support layer 20, which is a first resin portion, is formed. That is, the support layer 20 is formed as follows: A photosensitive polyimide is applied, exposed, and developed to form a polyimide pattern having openings communicating with the IDT 14 and the second wiring layers 15a. After the formation of the pattern, polyimide is cured by heating. Subsequently, an organic substance attached to the IDT 14 is removed with oxygen plasma. Openings 21 formed here are used as part of the through holes.

Instead of polyimide, a compound having sufficiently low outgassing, a sufficiently low halogen content, having heat resistance, and strength may be used. Examples thereof include benzocyclobutene and silicone.

Figure 5:
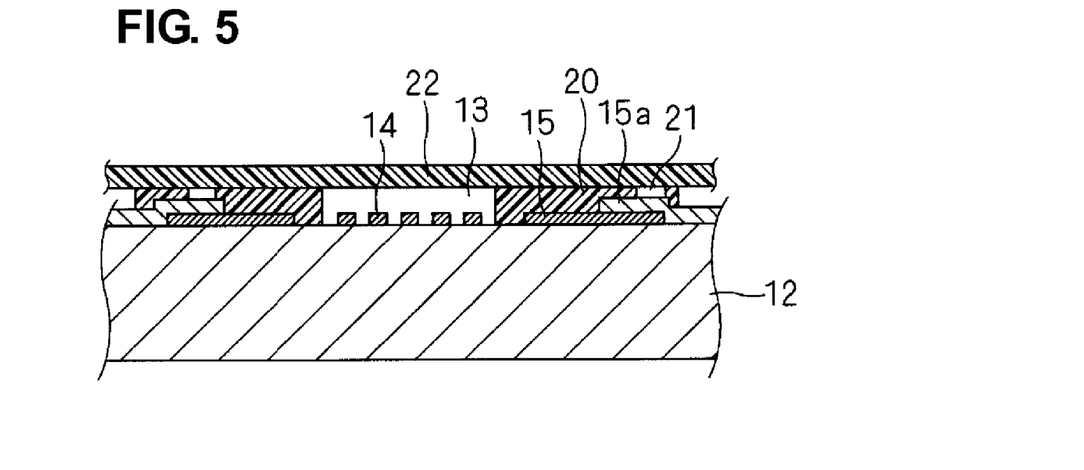
FIG. 5 is an explanatory drawing of the process of producing the piezoelectric device according to the first preferred embodiment of the present invention.

As shown in FIG. 5, the cover layer 22, which is a second resin portion, is formed. The cover layer 22 is formed of a polyimide film. The polyimide film has a thermoplastic polyimide resin as an adhesive layer disposed on a surface of the polyimide film. The film is laminated and bonded to the support layer 20 using a roller having a temperature of about 100° C. Thereby, the sealed space 13 around the IDT 14 is primarily sealed.

Figure 6:
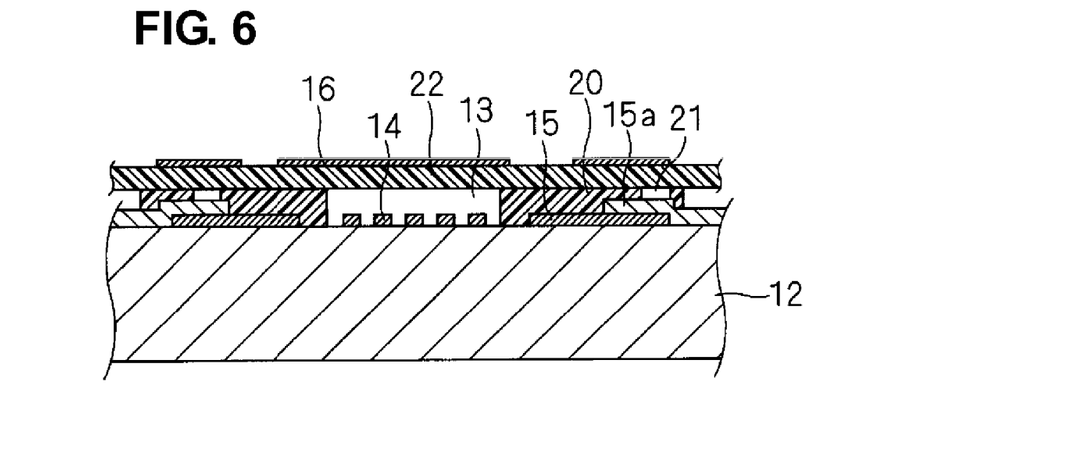
FIG. 6 is an explanatory drawing of the process of producing the piezoelectric device according to the first preferred embodiment of the present invention.

As shown in FIG. 6, metal films 16 are formed. That is, a resist pattern having openings through which the metal films 16 will be formed is formed on the cover layer 22. An Au film having a thickness of about 0.1 μm is formed by evaporation. The resist is removed by lift-off together with undesired metal films, thereby forming the metal films 16 having a target pattern.

Figure 7:
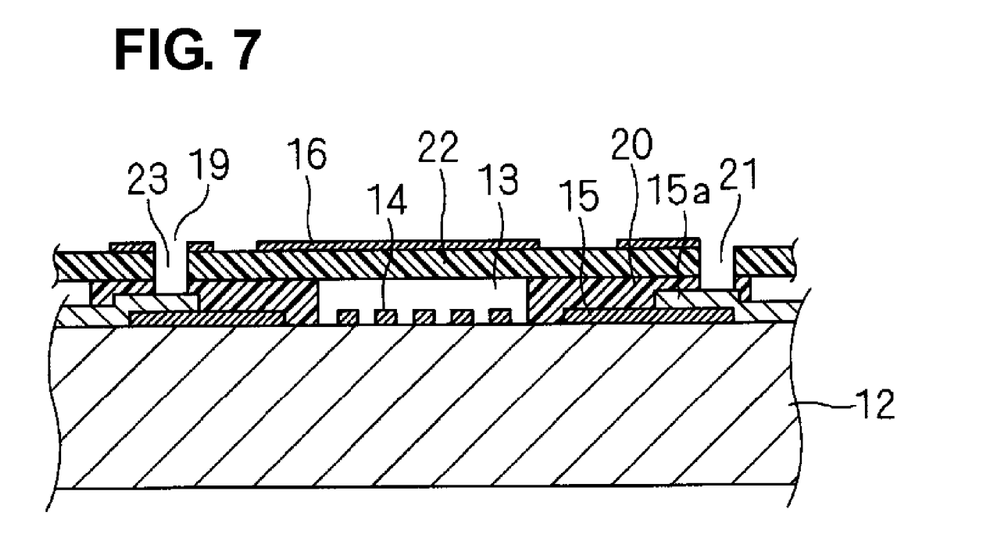
FIG. 7 is an explanatory drawing of the process of producing the piezoelectric device according to the first preferred embodiment of the present invention.

As shown in FIG. 7, through holes 23 and 19 communicating with the openings 21 in the support layer 20 are formed in the cover layer 22 and the metal films 16 using a laser beam. Desmearing, plasma treatment, and the like are performed to remove residues resulting from laser processing.

Figure 8A:
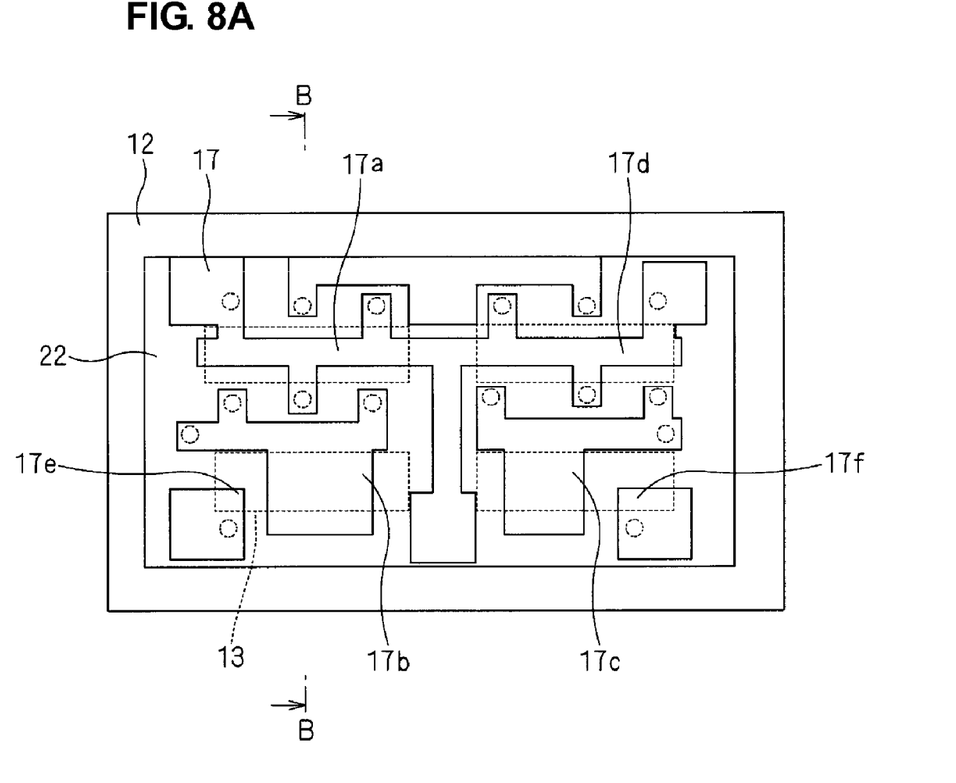
FIGS. 8A and 8B are explanatory drawings of the process of producing the piezoelectric device according to the first preferred embodiment of the present invention.
Figure 8B:
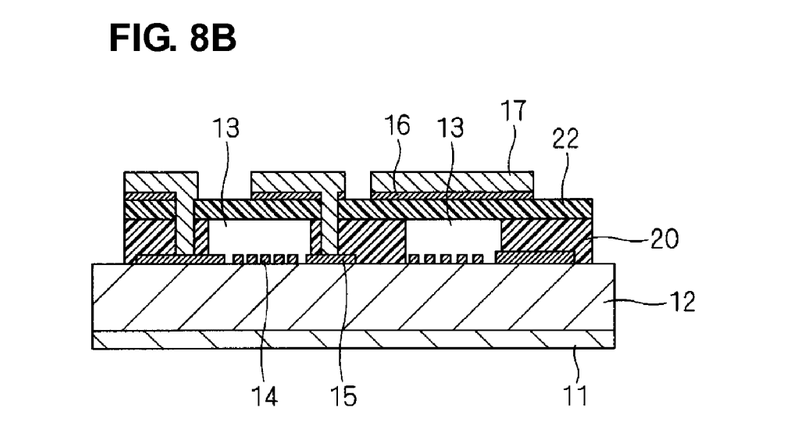

FIG. 8A is a plan view when viewed along line A-A in FIG. 10 in the subsequent step described below and FIG. 8B is a cross-sectional view taken along line B-B in FIG. 8A, which figures show connecting members 17 are disposed on the metal films 16. The pattern of the metal films 16 substantially conforms to the pattern of the connecting members 17. As shown in FIG. 8(a), with respect to the pattern of the metal films 16 formed, many films are intentionally formed above the sealed space 13. In particular, in the case where two different sides of each sealed space 13 intersect with a corresponding one of portions indicated by reference numerals 17e and 17f and where opposite sides of each sealed space 13 intersect with a corresponding one of portions indicated by reference numerals 17a, 17b, 17c, and 17d, each sealed space 13 is effectively reinforced. The arrangement of necessary leads indicated by reference numerals 17a and 17d or electrode lands indicated by reference numerals 17e and 17f above the sealed space 13 is effective in reinforcing the sealed space 13. Expanded portions indicated by reference numerals 17b and 17c and expanding in a direction intersecting the wiring direction are formed and located above the sealed space 13 so as to only increase the strength of the sealed space 13, thereby improving the strength of the cover layer 22 located above the sealed space 13.

Figure 9:
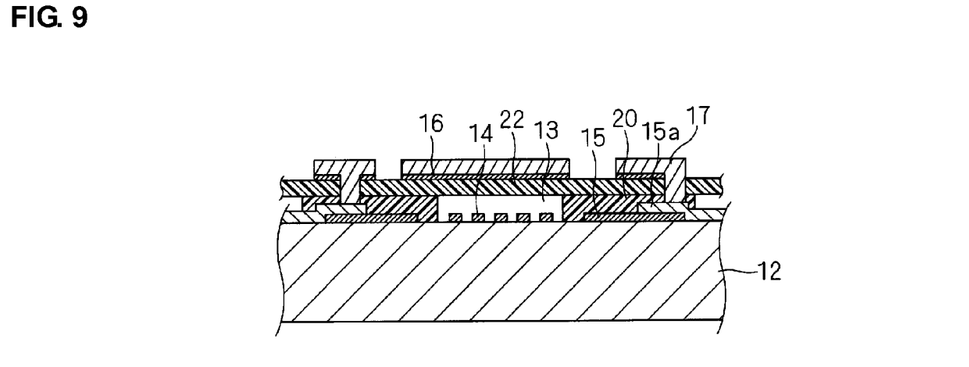
FIG. 9 is an explanatory drawing of the process of producing the piezoelectric device according to the first preferred embodiment of the present invention.

Specifically, as shown in FIG. 9, the through holes 21, 23, and 19 are filled with the connecting members 17 by electrolytic plating or electroless plating to form via holes. A Ni film having a thickness of about 20 μm is formed on the metal films 16 disposed on the cover layer 22. The connection of the via holes and the metal films 16 with the connecting members 17 further increases the strength of the cover layer 22 located above the sealed space 13. Preferably, plating films formed on the metal films 16 disposed on the cover layer 22 are each composed of a material having a large elastic modulus. Ni films are more preferred because they are easily formed by plating and each has a large elastic modulus. Each of the plating films may have a multilayer structure. Furthermore, the plating rate is relatively high. The time required for the formation of the film having a thickness of about 20 μm is about 10 minutes. Thus, the plating films do not cause an increase in costs.

Figure 10:
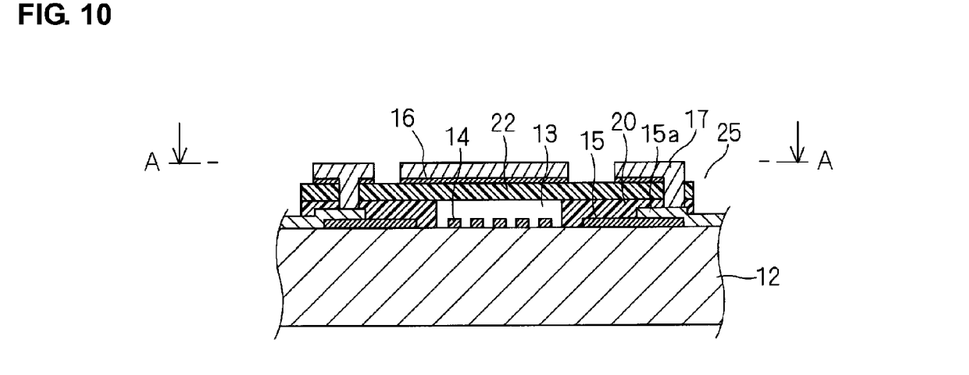
FIG. 10 is an explanatory drawing of the process of producing the piezoelectric device according to the first preferred embodiment of the present invention.

As shown in FIG. 10, the periphery 25 of the cover layer 22 is removed by a laser beam. Dry etching with oxygen plasma, wet etching with an etching solution, cutting with a dicing machine including a rotary blade, or the like may be performed instead of laser processing.

Figure 11:
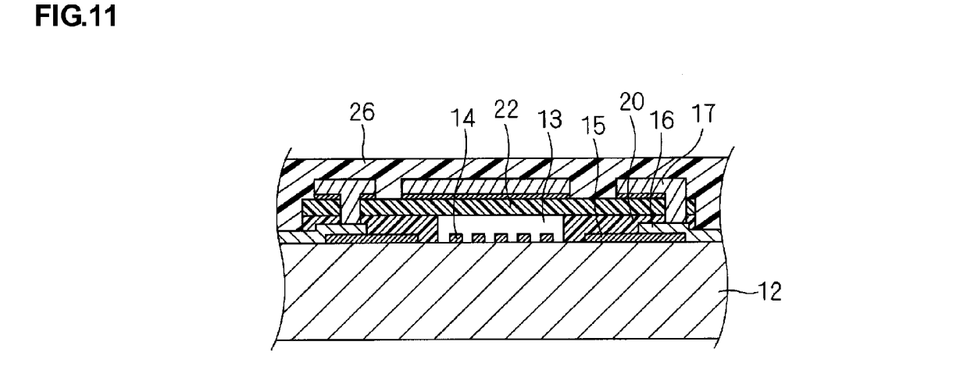
FIG. 11 is an explanatory drawing of the process of producing the piezoelectric device according to the first preferred embodiment of the present invention.

As shown in FIG. 11, the exterior resin 26 is formed. That is, an insulating epoxy-resin film is laminated. Alternatively, a liquid epoxy resin may be applied by printing to form an epoxy-resin film. Instead of the epoxy resin, an insulating material, e.g., a benzocyclobutene resin, a silicone resin, or a spin-on-glass (SOG), may be used. Subsequently, the insulating material is cured at about 240° C. in an oven.

Figure 12:
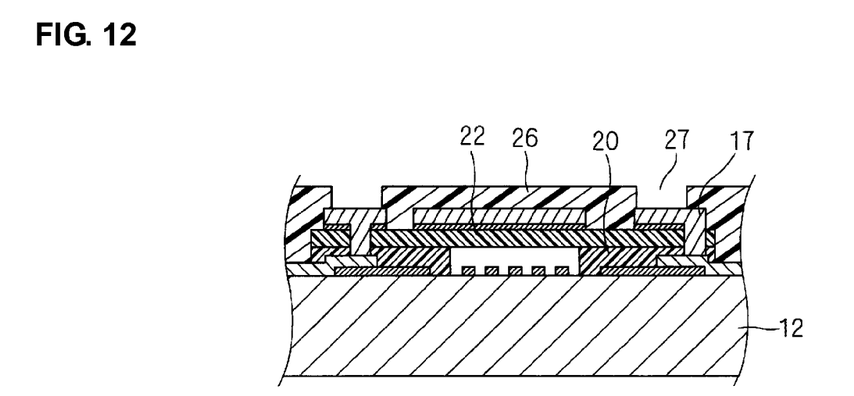
FIG. 12 is an explanatory drawing of the process of producing the piezoelectric device according to the first preferred embodiment of the present invention.
Figure 13:
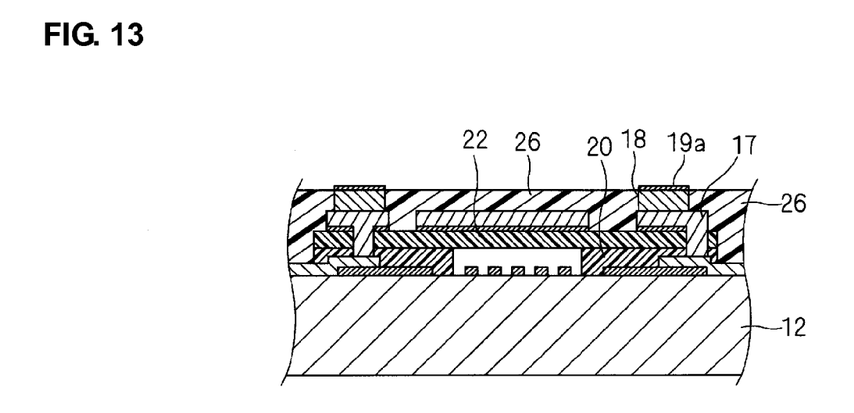
FIG. 13 is an explanatory drawing of the process of producing the piezoelectric device according to the first preferred embodiment of the present invention.

As shown in FIG. 12, through holes (via holes) 27 are formed in the exterior resin 26 with a laser beam. As shown in FIG. 13, the via holes are filled with a metal 18 by electrolytic plating. When the exterior resin 26 is composed of a photosensitive insulating material, via processing may be performed by photolithography. Alternatively, via processing may be performed by dry etching.

As shown in FIG. 13, the underbump metal layers 19a are formed.

Figure 14:
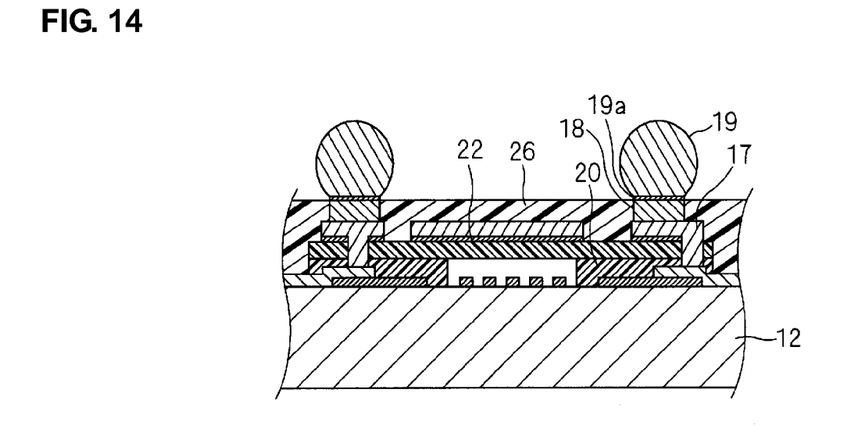
FIG. 14 is an explanatory drawing of the process of producing the piezoelectric device according to the first preferred embodiment of the present invention.

As shown in FIG. 14, solder paste is applied on the underbump metal layers 19a by printing with a metal mask. The solder paste is heated to form solder bumps serving as the external terminals 19.

Figure 15:
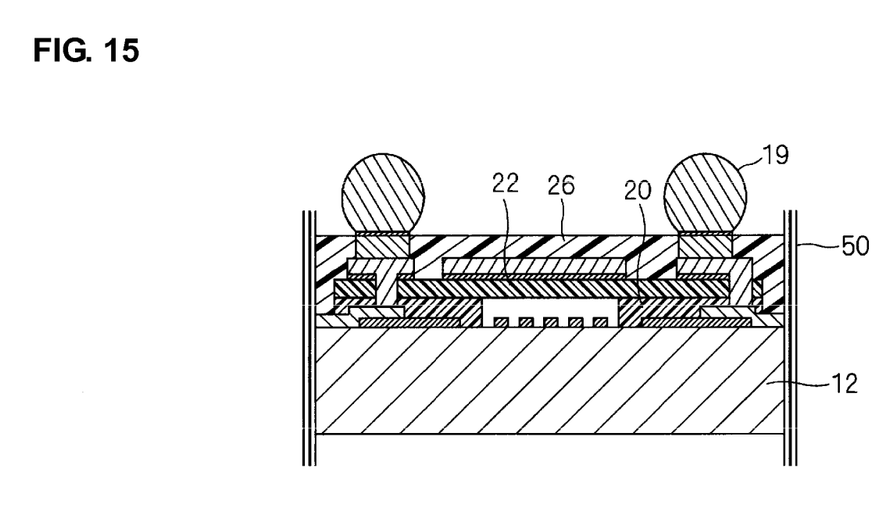
FIG. 15 is an explanatory drawing of the process of producing the piezoelectric device according to the first preferred embodiment of the present invention.

As shown in FIG. 15, the piezoelectric substrate 12 and the exterior resin 26 and the second wiring layers 15a located on the piezoelectric substrate 12 are cut into individual piezoelectric device chip pieces. Thereby, piezoelectric device chip is completed. Separation may be performed by cutting with a rotary blade 50, by cutting with a laser beam, or in combination of both.

Figure 16:
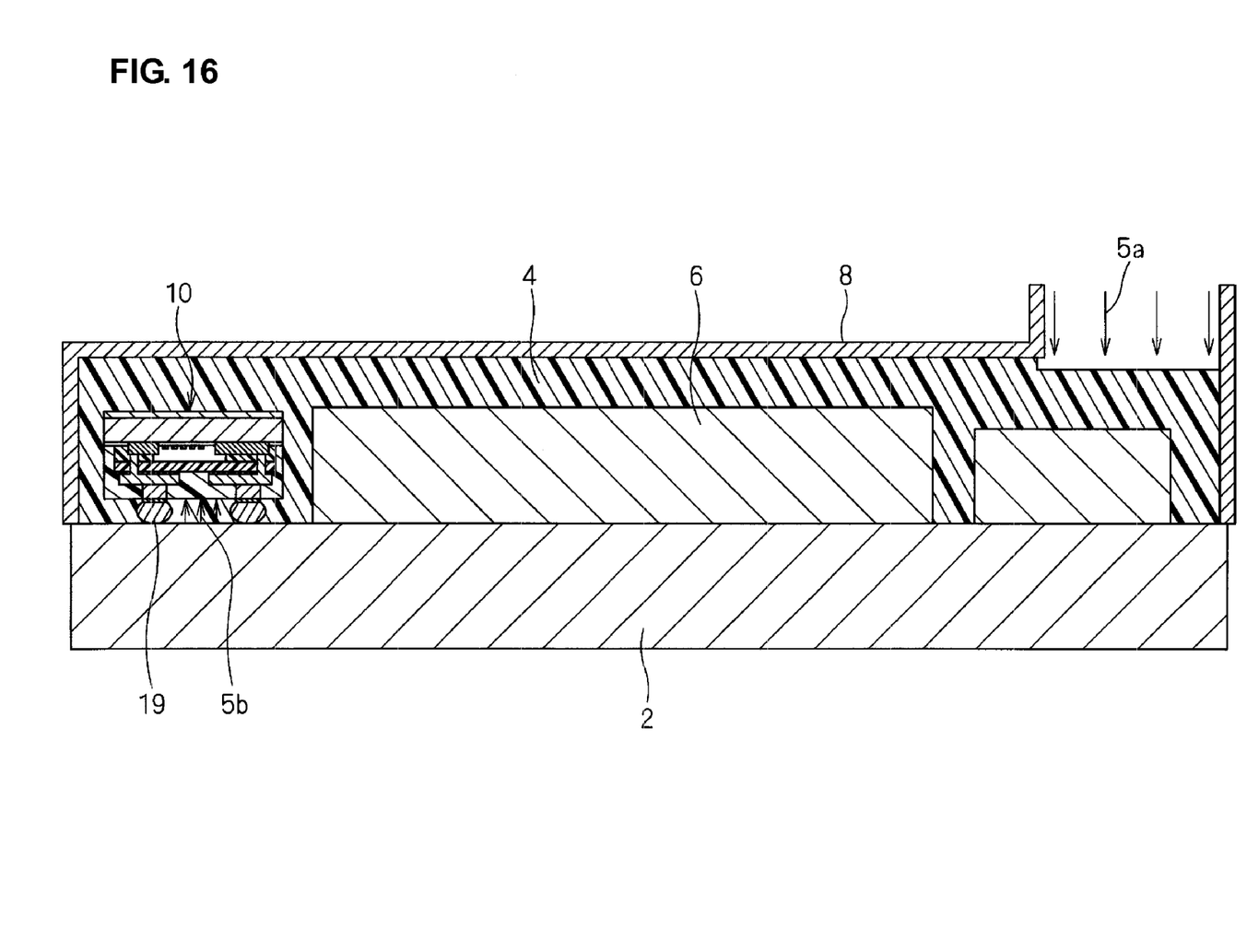
FIG. 16 is an explanatory drawing of the piezoelectric device subjected to resin molding according to the first preferred embodiment of the present invention.

For example, the resulting piezoelectric device 10 is mounted on a glass-epoxy circuit board 2 as shown in FIG. 16. After another device such as an IC chip 6 is mounted on the circuit board 2 in addition to the piezoelectric device 10, a molding resin 4 is injected into a mold 8 at, for example, about 180° C. and about 100 atm. Thereby, a module having some functions is completed.

The molding resin 4 is pressurized as indicated by arrows 5 during the above-described transfer molding. Thus, a force from the outside as indicated by arrows 5b acts on the piezoelectric device 10. Since the piezoelectric device 10 is reinforced with the wiring metal layer located above the sealed space 13, the sealed space 13 has improved resistance to molding. The use of the internal interconnection lines on the cover layer 22 or the formation of the thick metal films (plating films) on the cover layer 22 in order to increase the strength of the sealed space 13 simultaneously with the formation of the internal interconnection lines on the cover layer 22 ensures resistance to transfer molding with no increase in costs.

In this case, as described above, in the piezoelectric device 10, the support layer 20 and the cover layer 22 above the sealed space 13 have a buildup structure of a resin film and the like, thus facilitating a reduction in profile. Therefore, even when the piezoelectric device is mounted on a circuit board together with another device to form a module, the piezoelectric device does not cause an increase in the thickness of the module and results in the module having a sufficiently small thickness. Furthermore, the piezoelectric device can ensure sufficient strength such that the sealed space 13 does not collapse during transfer molding.

The piezoelectric device 10 sealed with a resin buildup structure, which facilitates a reduction in profile, ensures resistance to molding. Thus, a low-profile module can be made without an increase in costs or the use of an alumina package having a recess (cavity).

As described above, the piezoelectric device 10 is an inexpensive, low-profile piezoelectric device sealed with, for example, the resin buildup structure and can ensure resistance to transfer molding without an increase in costs.

EXAMPLE 2

A piezoelectric device in EXAMPLE 2 will be described with reference to FIGS. 17 to 24. The piezoelectric device in EXAMPLE 2 preferably has substantially the same structure as that of the piezoelectric device 10 in EXAMPLE 1. Hereinafter, the same components as those of the piezoelectric device 10 in EXAMPLE 1 are designated using the same reference numerals, and differences from the piezoelectric device 10 in EXAMPLE 1 will be mainly described.

Figure 17:
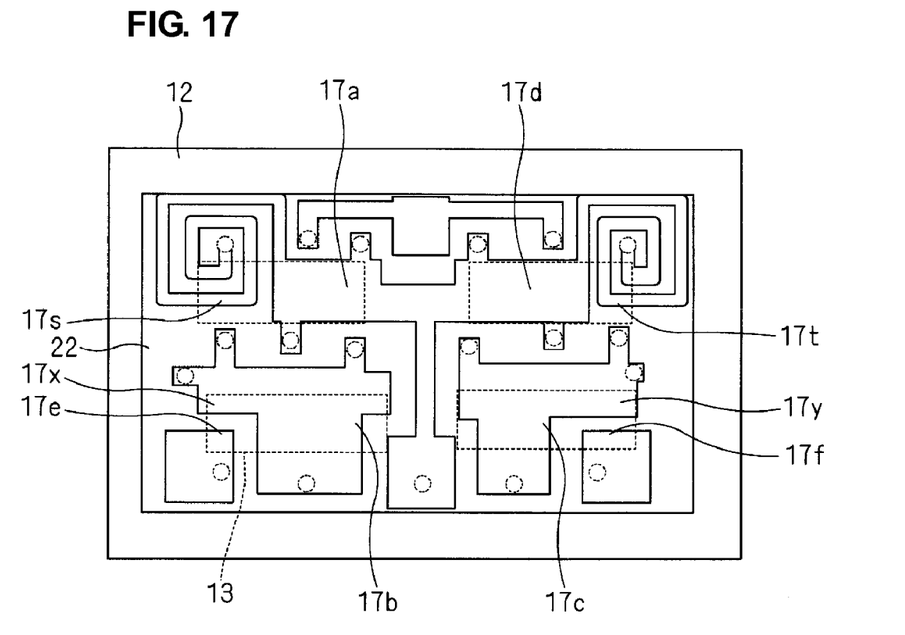
FIG. 17 is an explanatory drawing of a process of producing a piezoelectric device according to a second first preferred embodiment of the present invention.

FIG. 17 corresponds to FIG. 7(a) described in EXAMPLE 1. Structures of metal films and plating films formed on a cover layer differ from those in EXAMPLE 1.

That is, the metal films and plating films have detour portions 17s and 17t deviating from an original wiring direction and expanded portions 17x and 17y each having a width larger than an original line width and cover a substantially overall surface above the sealed space 13. The detour portions 17s and 17t intersect repeatedly above the sealed space 13. The expanded portions 17x and 17y expand from the original interconnection lines along a direction intersecting a wiring direction and overlap the sealed space 13.

The piezoelectric device in EXAMPLE 2 has the structure and thus has increased strength such that the sealed space 13 does not collapse.

In SAW filters, to obtain required electrical properties, it is known that inductors and capacitors are connected to resonators in parallel or series. To match an external circuit and convert impedance, it is known that circuit elements, such as inductors and capacitors, are connected to input and output terminals of devices.

The detour portions 17s and 17t in EXAMPLE 2 can be used as inductors.

Figure 18:
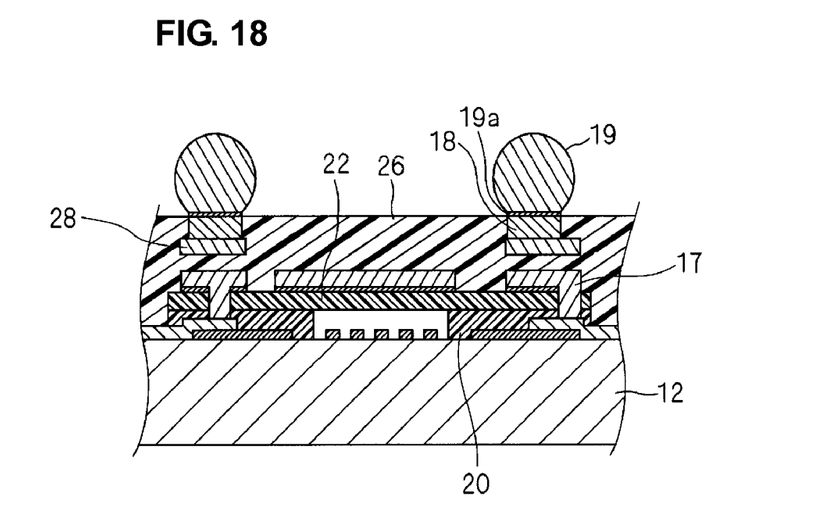
FIG. 18 is an explanatory drawing of the process of producing the piezoelectric device according to the second preferred embodiment of the present invention.
Figure 19:
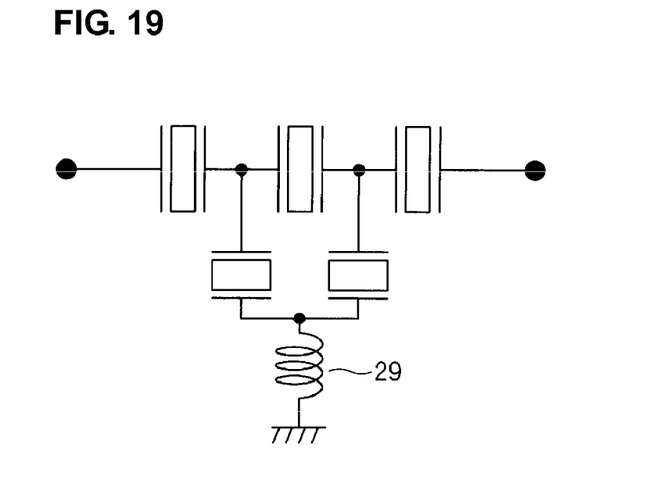
FIG. 19 is a circuit diagram of a SAW filter as an example of a piezoelectric device according to the second preferred embodiment of the present invention.
Figure 20:
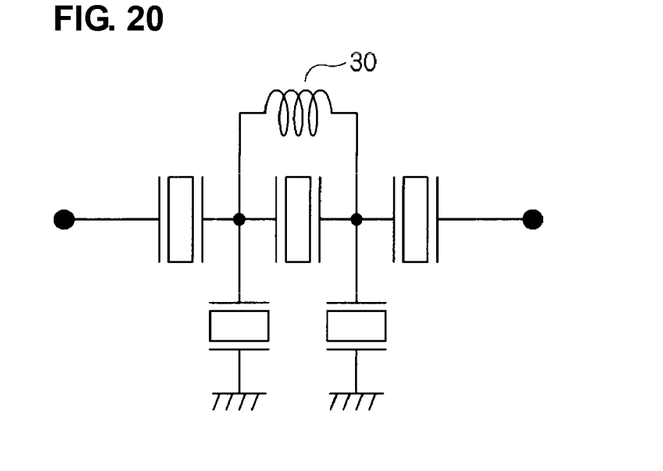
FIG. 20 is a circuit diagram of a SAW filter as an example of a piezoelectric device according to the second preferred embodiment of the present invention.
Figure 21:
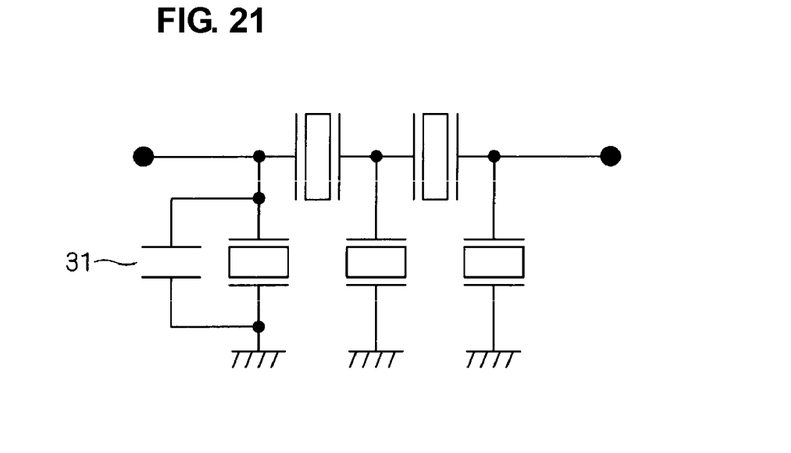
FIG. 21 is a circuit diagram of a SAW filter as an example of a piezoelectric device according to the second preferred embodiment of the present invention.
Figure 22:
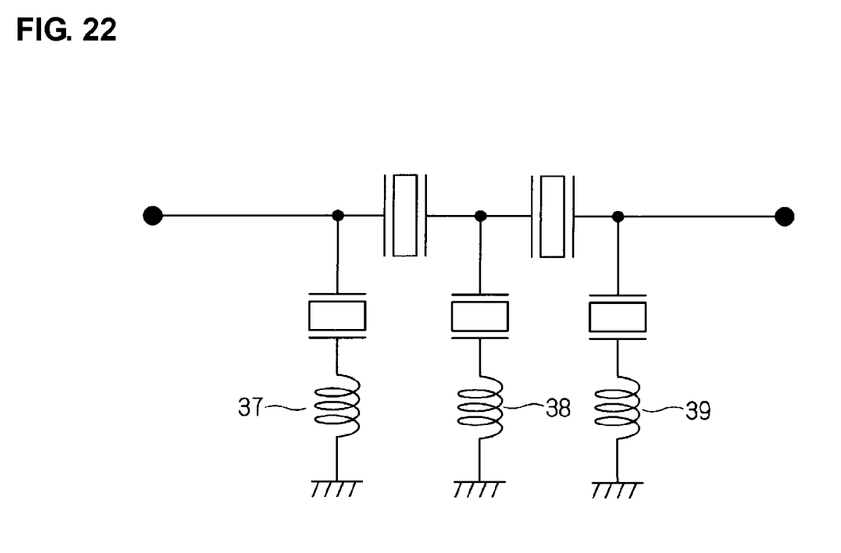
FIG. 22 is a circuit diagram of a SAW filter as an example of a piezoelectric device according to the second preferred embodiment of the present invention.

FIG. 18 shows an example of a structure having first electrodes disposed in the exterior resin 26. The expanded portions 17x and 17y are used as the first electrodes, and the conductive pattern 15 on the piezoelectric substrate 12 or an electrode pattern disposed in the exterior resin 26 with insulating members therebetween is used as a second electrode. In this case, the expanded portions 17x and 17y can be used as capacitors.

Furthermore, as shown in FIG. 18, the detour portions (17s and 17t) of the internal conductor 17, internal conductors 28 located thereabove, and an insulating material provided therebetween can constitute capacitors. In this case, an insulating member constituting the exterior resin 26 or another insulating material may be disposed between the internal conductors.

Figure 23:
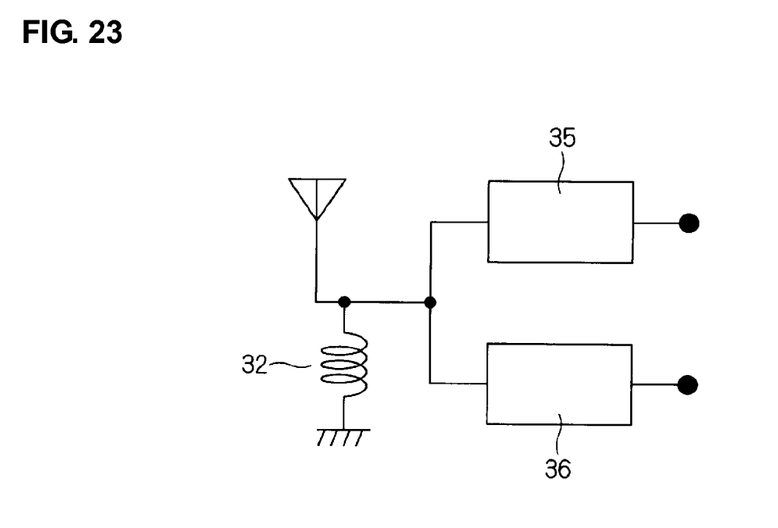
FIG. 23 is a circuit diagram of antenna duplexer according to the second preferred embodiment of the present invention.
Figure 24:
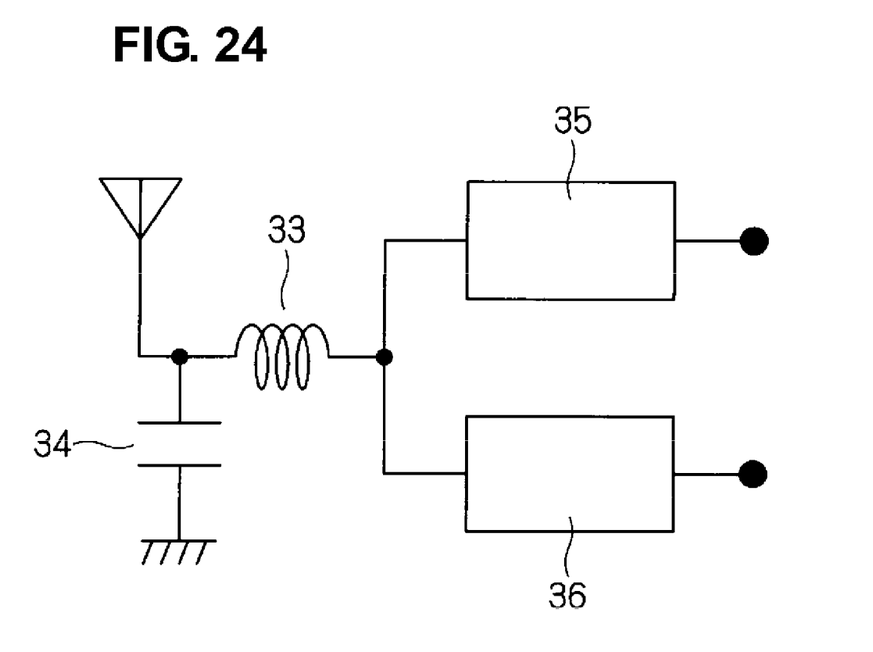
FIG. 24 is a circuit diagram of antenna duplexer according to the second preferred embodiment of the present invention.

Such a structure can be applied to various devices. For example, FIGS. 19, 20, 21, and 22 each show an example of a SAW filter. The structure can be used as inductors 29, 30, and 37 to 39 and a capacitor 21. FIGS. 23 and 24 each show an example of an antenna duplexer including a transmitting SAW filter 35, a receiving SAW filter 36, and matching elements. The structure can be used as inductors 32 and 33 and a capacitor 34.

EXAMPLE 3

A piezoelectric device in EXAMPLE 3 will be described with reference to FIG. 25. The piezoelectric device in EXAMPLE 3 has substantially the same structure as that of the piezoelectric device 10 in EXAMPLE 1. Hereinafter, the same components as those of the piezoelectric device 10 in EXAMPLE 1 are designated using the same reference numerals, and differences from the piezoelectric device 10 in EXAMPLE 1 will be mainly described.

Figure 25A:
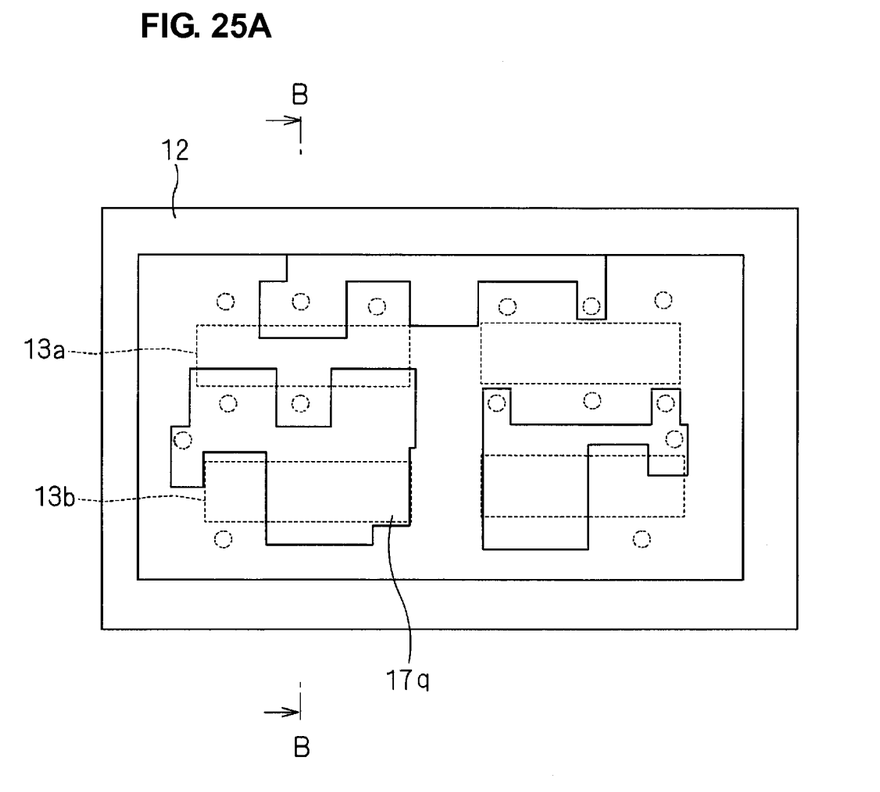
FIGS. 25A and 25B are explanatory drawings of a process of producing a piezoelectric device according to a third preferred embodiment of the present invention.
Figure 25B:
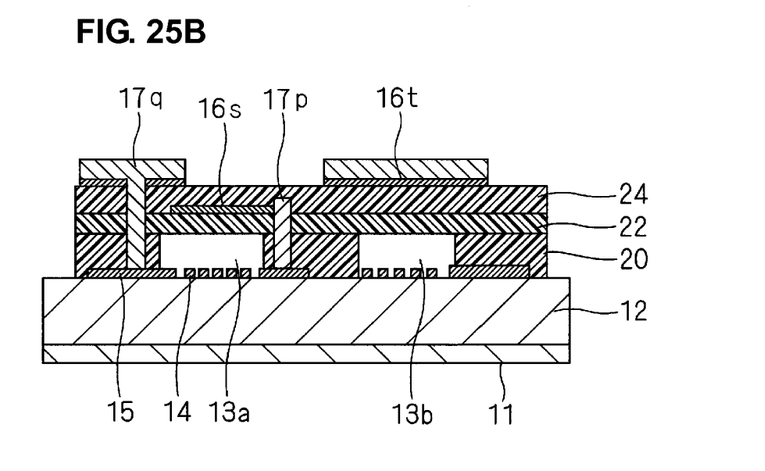

FIG. 25 corresponds to FIG. 7 described in EXAMPLE 1. Unlike the structure in EXAMPLE 1, in the piezoelectric device in EXAMPLE 3, an additional layer 24 is formed on the cover layer 22. A metal film 16s is formed between the cover layer 22 and the additional layer 24. A plating film 17q is formed on a metal film 16t located on the additional layer 24.

The piezoelectric device in EXAMPLE 3 is produced in substantially the same way as the piezoelectric device 10 in EXAMPLE 1. The same steps are performed as those shown in FIGS. 2 to 6 according to EXAMPLE 1. That is, a metal film 16s is formed on the cover layer 22 and connected to a via hole 17p. Subsequently, a photosensitive polyimide is applied, exposed, and developed to form the additional layer 24 having, if required, an opening. The metal film 16t is formed on the additional layer 24 by evaporation and lift-off. The strength of interconnection lines located on the metal film 16t is reinforced with the plating film 17q formed by electrolytic plating. Then, cover-film-line processing with a laser beam, lamination of a sealing resin, laser processing, and the like are performed in the same way as in EXAMPLE 1.

The interconnection lines on the cover layer 22 have two layers. The metal film 16s and 16t are disposed on substantially the overall surface above sealed space 13a and 13b, respectively. The sealed space 13a is reinforced with the lower metal film 16s. The sealed space 13b is reinforced with the upper metal film 16t and the plating film 17q.

As described above, the interconnection metal layers with the reinforcing plating films are disposed above the sealed space. The use of the interconnection metal layers formed on the sealed space or the formation of the thick metal films simultaneously with the formation of the interconnection metal layers ensures the piezoelectric device having resistance to molding with no increase in costs.

The plating films disposed above the sealed space include dummy portions expanding in a direction different from an original interconnection pattern connected to the via hole conductor. The dummy portions can further increase strength.

The use of the interconnection metal layers formed above the sealed space as a circuit element or part of a circuit element results in miniaturization of the piezoelectric device.

The piezoelectric device and the method for producing the piezoelectric device are not limited to the above-described EXAMPLES of preferred embodiments of the present invention. Various changes may be made.

For example, the present invention is not limited to the SAW filters but may be applied to piezoelectric devices such as SAW resonators and BAW filters.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A piezoelectric device comprising:
   an elemental substrate including a piezoelectric element and a conductive pattern electrically connected to the piezoelectric element disposed on at least one main surface of the elemental substrate;
   an insulating member disposed on the main surface side of the elemental substrate and surrounding the piezoelectric element leaving a space around the piezoelectric element; and
   an internal conductor disposed in the insulating member so as to be connected to the conductive pattern, and extending so as to be spaced apart from the elemental substrate; wherein
   the internal conductor includes an expanded portion expanding in a direction intersecting a wiring direction of the internal conductor or a detour portion that deviates from the wiring direction; and
   the expanded portion or the detour portion crosses a boundary of a sealed space formed around the piezoelectric element when viewed from the direction normal to the main surface of the elemental substrate.

2. The piezoelectric device according to claim 1, wherein the sealed space has a substantially rectangular shape when viewed from the direction normal to the main surface of the elemental substrate, and the internal conductor has a portion intersecting at least two opposite sides of the sealed space when viewed from the direction normal to the main surface of the elemental substrate, the portion including the expanded portion or the detour portion.

3. The piezoelectric device according to claim 1, wherein the sealed space has a substantially rectangular shape when viewed from the direction normal to the main surface of the elemental substrate, and the internal conductor has a portion intersecting at least two adjacent sides of the sealed space when viewed from the direction normal to the main surface of the elemental substrate, the portion including the expanded portion or the detour portion.

4. The piezoelectric device according to claim 1, wherein the internal conductor is disposed on at least about ½ of the area of the sealed space when viewed from the direction normal to the main surface of the elemental substrate.

5. The piezoelectric device according to claim 1, wherein the internal conductor is disposed on substantially the entire area of the sealed space when viewed from the direction normal to the main surface of the elemental substrate.

6. The piezoelectric device according to claim 1, wherein at least a portion of the internal conductor disposed within the sealed space is made of a plating film including a metal material when viewed from the direction normal to the main surface of the elemental substrate.

7. The piezoelectric device according to claim 6, wherein the metal plating film of the internal conductor has a thickness of about 10 μm or more.

8. The piezoelectric device according to claim 1, wherein the internal conductor contains a metal material having an elastic modulus of about $1.3 \times 10^{11}$ Pa or more.

9. The piezoelectric device according to claim 1, wherein the internal conductor is composed of a metal material mainly including Ni.

10. The piezoelectric device according to claim 1, wherein the piezoelectric element is an element utilizing a surface acoustic wave or a bulk wave.

11. The piezoelectric device according to claim 1, wherein the expanded portion or the detour portion defines a circuit element or a portion of a circuit element.

12. The piezoelectric device according to claim 1, wherein the expanded portion or the detour portion defines an inductor.

13. The piezoelectric device according to claim 1, wherein the expanded portion or the detour portion defines a portion of a capacitor.

14. The piezoelectric device according to claim 1, wherein the expanded portion or the detour portion is electrically connected to the piezoelectric element.

15. The piezoelectric device according to claim 1, wherein the expanded portion or the detour portion is located between different insulating member segments.

16. The piezoelectric device according to claim 1, wherein the expanded portion or the detour portion is located between an insulating member segment in contact with the sealed space and having a hollow structure and an insulating member segment in contact with an outer surface and defining an exterior resin.

\* \* \* \* \*